United States Patent [19]

D'Arrigo et al.

[11] Patent Number: 5,168,335
[45] Date of Patent: Dec. 1, 1992

[54] ELECTRICALLY PROGRAMMABLE, ELECTRICALLY ERASABLE MEMORY ARRAY CELL WITH FIELD PLATE

[75] Inventors: Iano D'Arrigo, Houston; Manzur Gill, Rosharon; Sung-Wei Lin, Houston, all of Tex.

[73] Assignee: Texas Instruments Incorporated, Dallas, Tex.

[21] Appl. No.: 741,975

[22] Filed: Aug. 6, 1991

Related U.S. Application Data

[63] Continuation of Ser. No. 374,381, Jun. 30, 1989, abandoned, which is a continuation-in-part of Ser. No. 219,529, Jul. 15, 1988, abandoned.

[51] Int. Cl.⁵ .................... H01L 29/68; H01L 29/78; H01L 29/40; H01L 29/34
[52] U.S. Cl. .................... 257/319; 365/900; 365/185; 257/321; 257/389
[58] Field of Search .................... 357/23.5, 23.6, 53, 357/54

[56] References Cited

U.S. PATENT DOCUMENTS

| | | | |
|---|---|---|---|
| 4,750,024 | 6/1988 | Schreck | 357/23.5 |
| 4,853,895 | 8/1989 | Mitchell et al. | 357/23.5 |
| 4,907,197 | 3/1990 | Uchida | 357/23.5 |
| 4,912,676 | 3/1990 | Paterson et al. | 365/185 |
| 4,924,437 | 5/1987 | Paterson et al. | 365/185 |
| 4,947,222 | 8/1990 | Gill et al. | 357/23.5 |

*Primary Examiner*—Rolf Hille
*Assistant Examiner*—Wael Fahmy
*Attorney, Agent, or Firm*—W. James Brady, III; B. Peter Barndt; Richard L. Donaldson

[57] ABSTRACT

A pair of electrically erasable, electrically programmable memory cells are formed at a face of a semiconductor layer (10) and include respective source regions (30a, 30b), a shared drain region (28) and respective channel regions (38a, 38b). Each cell has a floating gate conductor (46a, 46b) that controls the conductance of a respective subchannel region (74a, 74b) and may be programmed through Fowler-Nordheim electron tunneling through a respective tunnel oxide window (40a, 40b) from a respective source region (30a, 30b). A field plate conductor (40a) controls the conductance of respective subchannel regions (70a, 70b) within each channel region (38a, 38b). A word line or control gate conductor (62) is insulatively disposed adjacent respective third, remaining channel subregions (53a, 53b) and further is disposed insulatively adjacent the floating gates (46a, 46b) to program or erase them.

8 Claims, 6 Drawing Sheets

ELECTRICALLY PROGRAMMABLE, ELECTRICALLY ERASABLE MEMORY ARRAY CELL WITH FIELD PLATE

This application is a continuation of application Ser. No. 07/374,381 now abandoned, filed Jun. 30, 1989 which is a continuation-in-part of co-pending U.S. patent application Ser. No. 07/219,529, filed Jul. 15, 1988, abandoned.

RELATED APPLICATIONS

This application is further related to U.S. patent application Ser. No. 07/219,530, filed Jul. 15, 1988, abandoned; co-pending U.S. patent application Ser. No. 07/219,528, filed Jul. 15, 1988, abandoned; co-pending U.S. patent application Ser. No. 07/385,846, filed Jul. 26, 1989, U.S. Pat. No. 4,947,222; co-pending U.S. patent application Ser. No. 07/374,113, filed Jun. 30, 1989, U.S. Pat. No. 5,047,987; co-pending U.S. patent application Ser. No. 07/458,936, filed Dec. 29, 1989, U.S. Pat. No. 5,010,028.

TECHNICAL FIELD OF THE INVENTION

The present invention relates generally to electrically erasable and programmable read only memories (EEPROM's), and more particularly to an EEPROM array capable of bulk or block erasure and a method of manufacture of such device.

BACKGROUND OF THE INVENTION

EPROMs, or electrically-programmable ROMs, are field-effect devices with a floating-gate structure. An EPROM floating gate is programmed by applying proper voltages to the source, drain and control gate of each cell, causing high current through the source-drain path and the charging of the floating gate by hot electrons. The EPROM device is erased by ultraviolet light, which requires a device package having a quartz window above the semiconductor chip. Packages of this type are expensive in comparison with the plastic packages ordinarily used for other memory devices such as DRAMs (dynamic random-access memories). For this reason, EPROMs are generally more expensive than plastic-packaged devices. EPROM devices of this type, and methods of manufacture, are disclosed in U.S. Pat. Nos. 3,984,822, 4,142,926, 4,258,466, 4,376,947, 4,326,331, 4,313,362, and 4,373,248. Of particular interest to this invention is U.S. Pat. No. 4,750,024, issued Jun. 7, 1988 and filed Feb. 18, 1986 by John F. Schreck and assigned to Texas Instruments Incorporated, wherein an EPROM is shown to be made by a method similar to that of U.S. Pat. No. 4,258,466, but with an offset floating gate.

EEPROMs, or electrically-erasable, electrically-programmable ROMs, have been manufactured by various processes, usually requiring a much larger cell size than standard EPROMs, and requiring more complex manufacturing processes. EEPROMs can be mounted in opaque plastic packages that reduce the packaging cost. Nevertheless, EEPROMs have been more expensive on a per-bit basis, in comparison with EPROMs, due to larger cell size and to more complex manufacturing processes.

Flash EEPROMs have the advantage of smaller cell size in comparison with standard EEPROMs because the cells are not erased individually. Instead, the array of cells may be erased in bulk or by blocks of cells.

Prior flash-erasable, Fowler-Nordheim tunneling-programmable EEPROMs have usually required two bit lines per cell. Co-pending application Ser. No. 07/219,529 illustrates an example of an array of such cells. For each column of cells in this array, two parallel bit lines are diffused into the face of the semiconductor layer, one each for the source and drain. Respective metal bit lines overlie and run parallel to the diffused source and drain bit lines. Usually, the pitch of the metal bit lines is a critical limitation in down-scaling the size of the array. As the search continues for devices of smaller and smaller area having the same functionality, it has therefore become desirable to devise an EEPROM cell having less than two bit lines per memory cell.

SUMMARY OF THE INVENTION

The present invention presents a distinct advantage over prior art flash-erasable EEPROMs in that each cell shares a drain bit line with another cell, and therefore uses only one and one-half buried bit lines per cell, thus saving array area and relaxing metal pitch.

According to one aspect of the invention, a source region is formed in a semiconductor layer of a first conductivity type to be of a second, opposite conductivity type. A drain region is formed in the semiconductor layer to be of the second conductivity type and to be spaced from the source region. The source and drain regions define a channel region that in turn comprises first, second and third subchannel regions.

A floating gate conductor is insulatively disposed over the face of the semiconductor layer in which the source and drain regions are formed. A portion of the floating gate conductor is insulatively disposed over the first subchannel region, so as to render it conductive when a predetermined positive programmed voltage resides on the floating gate conductor. A further portion of this floating gate conductor is disposed insulatively adjacent the source region. A tunnel window is formed between this further portion of the floating gate conductor and the source region to allow selective programming of the floating gate conductor.

A field plate conductor has at least a portion thereof insulatively disposed over the second subchannel region so as to render it conductive upon application of a predetermined field plate read voltage to the field plate conductor. A control gate conductor has a portion thereof insulatively disposed adjacent the third subchannel region so as to render it conductive upon application of a predetermined control gate read voltage. A further portion of the control gate conductor is insulatively disposed adjacent the floating gate conductor so as to be electrically coupled thereto, such that upon application of predetermined programming voltages to the source region and the control gate conductor, the floating gate conductor will be programmed (such as with a negative voltage) as a result.

In a further aspect of the invention, the drain region, which is preferably an elongate implanted region at the face of the semiconductor layer, is shared by two cells on either side thereof. The field plate conductor resides insulatively over the drain region. One of the source regions or bit lines is selected while the other is deselected to prevent write disturb of the deselected cell. A principal technical advantage of the invention is that only three bit lines for a pair of cells are needed, since the drain region is shared between two adjacent cells.

BRIEF DESCRIPTION OF THE DRAWINGS

Other aspects of the invention and their advantages will be discerned when one refers to the following detailed description as taken in conjunction with the drawings, in which.

DETAILED DESCRIPTION OF THE INVENTION

Figures 1, 2:
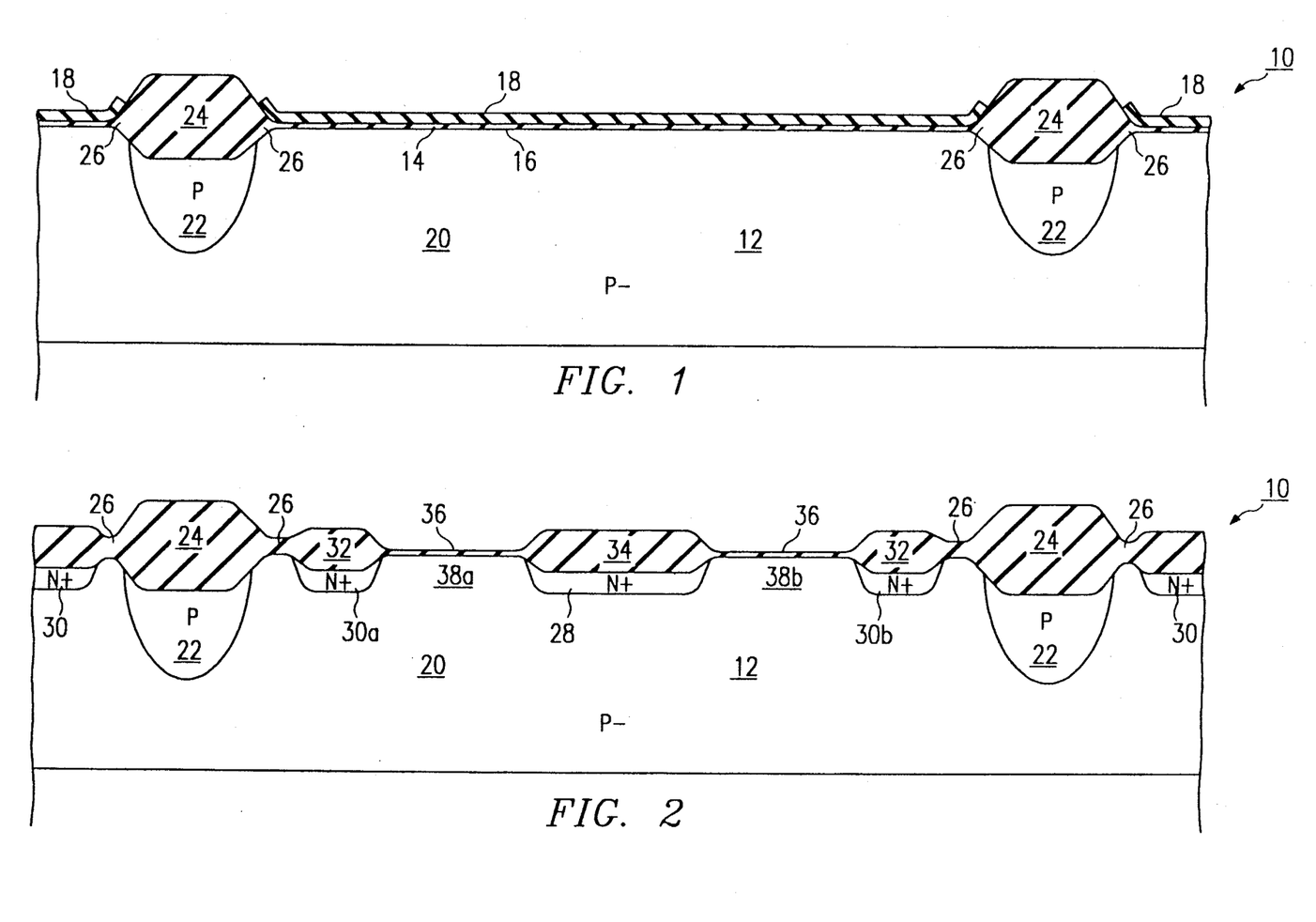
FIGS. 1-7 are greatly enlarged schematic elevational sectional views of a semiconductor layer showing progressive stages in the fabrication of a pair of EEPROM cells according to the invention.

Referring first to FIG. 1, a semiconductor substrate or layer 10 is shown having a (p−) epitaxial layer 12 grown thereon. A layer 14 of oxide is deposited or grown on the surface 16 of (p−) region 12. This is followed by the deposition of a nitride layer 18 on top of the oxide layer 16. The nitride layer 18 is patterned and etched to define an active device area 20 over which it resides, which will later include a drain region, two source region and two channel regions of a pair of EEPROM cells.

The fabrication process detailed herein omits steps necessary for the cofabrication of a plurality of CMOS logic transistors sited in the periphery of the chip. Since the techniques for fabricating such transistors are conventional, they will not be described here.

A boron implant at a dose of approximately $8 \times 10^{12}$ cm$^{-2}$ is performed to create (p) channel stop regions 22. Then, thick field oxide regions 24 are thermally grown in a localized oxidation process to a thickness of approximately 9,000 angstroms by exposing the substrate to steam at about 900° C. for several hours using any of several conventional techniques. The thermal oxide regions 24 grow beneath the edges of adjacent nitride layers 18, creating bird's beaks 26 instead of sharp transitions.

Referring next to FIG. 2, the nitride layer 18 is removed. A layer (not shown) of photoresist is deposited and patterned to act as an implant mask for an arsenic implant at a dose of about $6 \times 10^{15}$ cm$^{-2}$ and at an energy of about 135 KeV. This implant creates a drain region 28 and a pair of source regions 30a and 30b inside the active device area 20. As will be later explained in conjunction with FIG. 8, each active device area 20 is an elongate column of cells containing several pairs of EEPROM cells. Only one complete pair of such cells is shown in the section taken in FIGS. 1-7.

Following the implant of the drain region 28 and the source regions 30a and 30b, another thermal step is performed with steam at 800°-900° C. to differentially grow oxide regions 32 and 34. The thick oxide regions 32 and 34 will be grown to a thickness of approximately 2,500 to 3,500 Angstroms. At the same time, a thinner oxide layer 36 is formed between the drain region 28 and the source regions 30a and 30b and may have a thickness of approximately 200-300 Angstroms. The oxidation step may be adjusted to change the thickness of the oxide 36, and therefore the final thickness of the gate oxide as described below. The oxide regions 32 and 34 define the lateral limits of a pair of channel regions 38a and 38b.

At the transition areas 26 where bird's beaks have been formed, the edge of the originally-formed thermal oxide has masked the arsenic implant so that the concentration is lower. Therefore, the oxide growth in that area is less than that of the oxide 32 or of the oxide 24.

Figure 3:
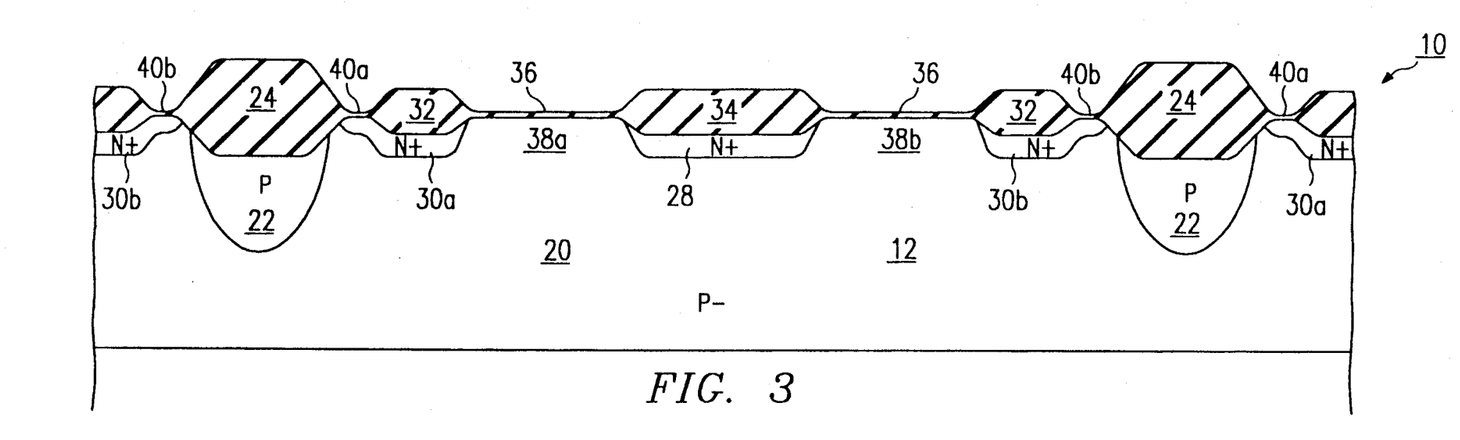

Referring next to FIG. 3, windows are opened in the oxide in the transition areas 26. This is done by etching through the oxide over the transition area 26 to the silicon using photoresist as a mask, and then regrowing thinner oxide for the tunnel windows. This will create window oxide layers 40a and 40b that are approximately 100 angstroms thick. At the time that this oxidation occurs, the gate oxide layer 36 will grow to approximately 350 Angstroms, depending on its thickness before this step, which may be adjusted as described above. A light phosphorus implant is preferably employed through the tunnel windows 40a and 40b to improve the operation of the cells. Because of the curved surface of the transition areas 26, the width of the tunnel windows 40a and 40b may be controlled by varying the length of time for the etch through the transition areas 26.

Figure 4:
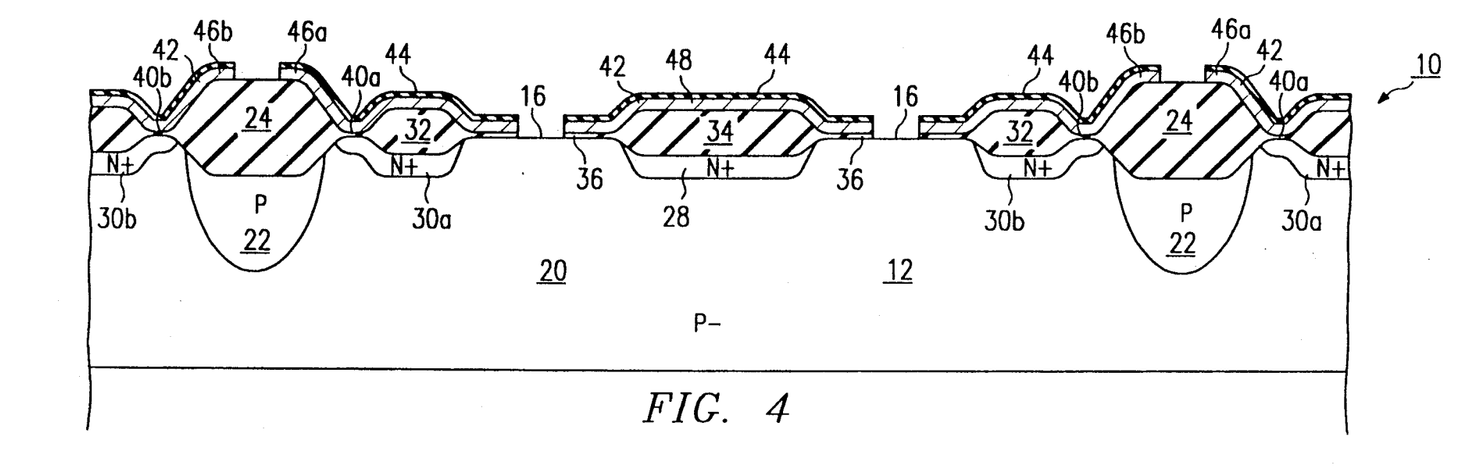

Referring next to FIG. 4, a layer 42 of polycrystalline silicon (polysilicon) is deposited over the face of the slice. Layer 42 is deposited to a thickness of approximately 3,500 Angstroms. The polysilicon layer 42 (also known as the "poly 1" layer) is highly doped to render it conductive. This may be accomplished, for example, by applying an (n+) dopant to the polysilicon layer 42 after it has been deposited. A relatively thin interlevel insulator layer 44 such as a oxide/nitride/oxide (ONO) sandwich is next formed using conventional techniques.

The ONO layer 44 is next patterned and etched, followed by a self-aligned plasma etch of the polysilicon layer 42 to partially define first and second floating gate conductors 46a and 46b, as well as a poly 1 field plate conductor 48. This etching step defines the floating gate conductors 46a and 46b in an x-direction only, where x is coplanar with the section shown. In a y direction perpendicular to the paper, the conductors 46a, 46b and 48 exist at this point as long contiguous parallel strips stretching over every pair of cells in the same column as the illustrated cells. The definition of the conductors 46a and 46b in a y-direction takes place in a stack etch described below. After the etch, the exposed areas of oxide layer 36 are stripped away from the silicon surface 16.

Figure 5:
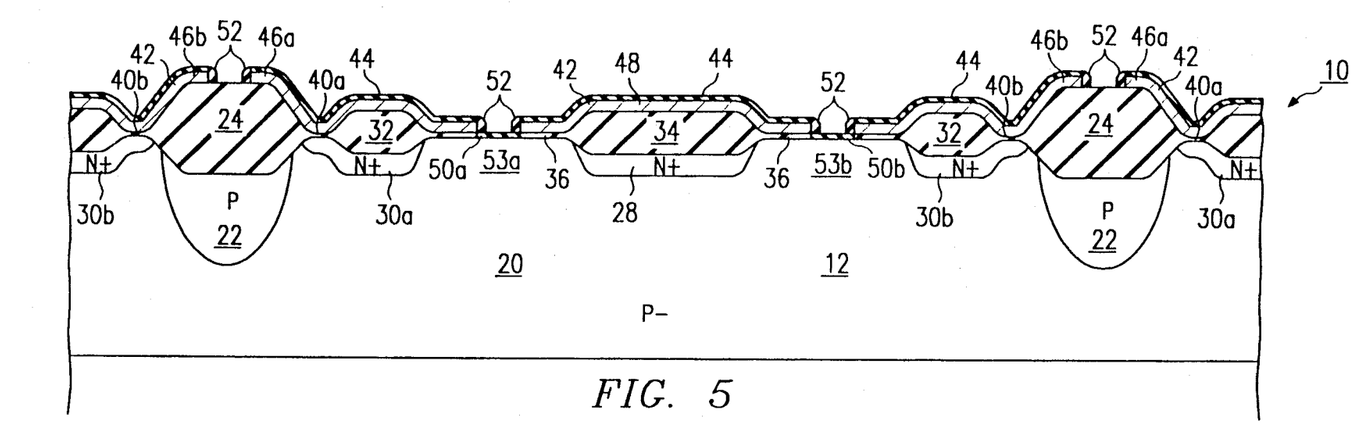

Referring now to FIG. 5, an oxidation step is performed to grow new gate oxide layers 50a and 50b to a thickness of approximately 400 to 500 Angstroms. Oxide regions 52 also will grow at this time from the exposed ends of polysilicon gate conductors 46a, 46b and 48. Next, a self-aligned threshold voltage adjust implant is performed for subchannel regions 53a and 53b.

Figure 6:
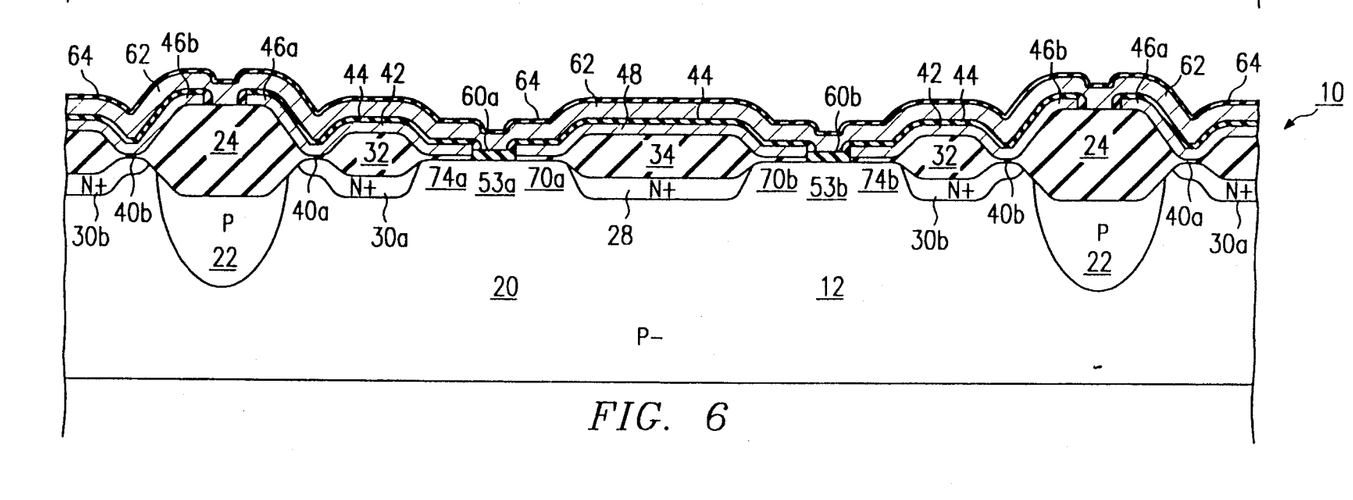

Referring next to FIG. 6, a second polycrystalline silicon layer 62 ("poly 2") is next deposited over the face of the slice and is highly doped to be (n+). The polysilicon layer is deglazed. Next, a stack etch of (1) the second polysilicon layer 62, (2) the interlevel insulator layer(s) 44, and (3) the first poly conductors 46a and 46b is performed. This stack etch defines a plurality of elongated word line conductors 62 that run substantially parallel to each other in an x-direction and are spaced apart from one another in a y-direction. This same stack etch separates and defines the floating gate conductors 46a and 46b in a y-direction. The field plate conductor 48 is masked such that it will continue to be an elongated conductor running in the y-direction. Peripheral logic CMOS devices may be completed after this step. An oxide layer 64 is grown after this process on the sides and top of the stack.

Figure 7:
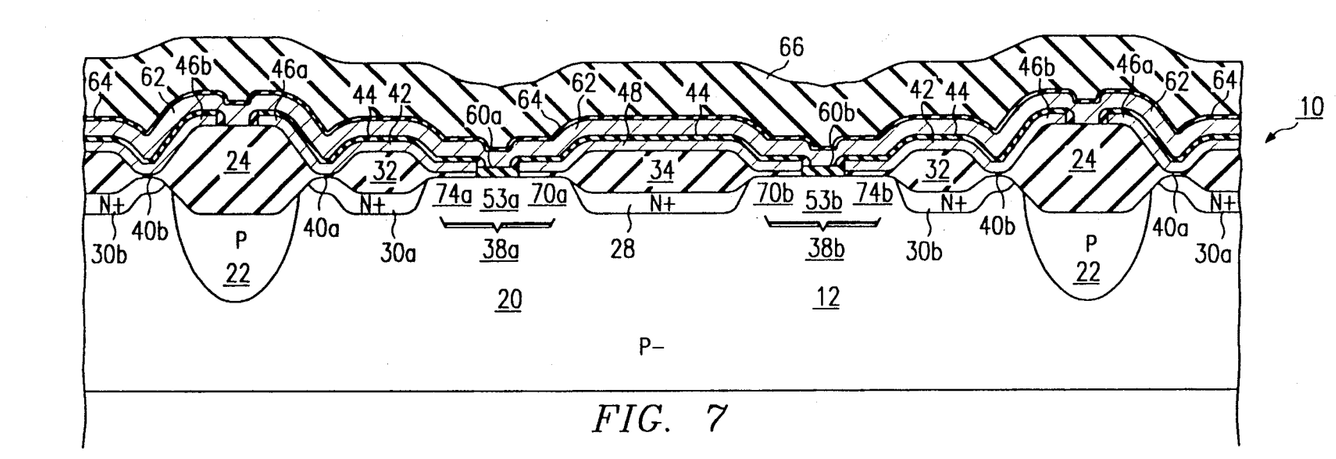

FIG. 7 shows a sectional view of an almost-completed device. A borophosphosilicate glass (BPSG) layer 66 has been deposited over the face of the slice. Off-array contacts (not shown) are made through the BPSG layer 66, as are on-array contacts (not shown; see FIG. 8) that are made from metal bit lines (not shown) to respective diffused regions 30a, 30b and 28 periodically in a y-direction. The metal bit lines are formed on the BPSG layer 66 to run over and be parallel to respective diffused regions 30a, 28 and 30b.

Each channel region 38a and 38b consists of three subchannel regions 70a, 53a and 74a, and 70b, 53b and 74b. The field plate conductor 48 controls the conductance of subchannel regions 70a and 70b. The floating gate conductors 46a and 46b respectively control the conductance of subchannel regions 74a and 74b. Lastly, the wordline conductor formed by the second level poly layer 62 controls the conductance of subchannel regions 53a and 63b, as separated from the word line 62 by gate oxide layers 60a and 60b that have grown to a thickness of approximately 400 to 500 Angstroms.

Figure 8:
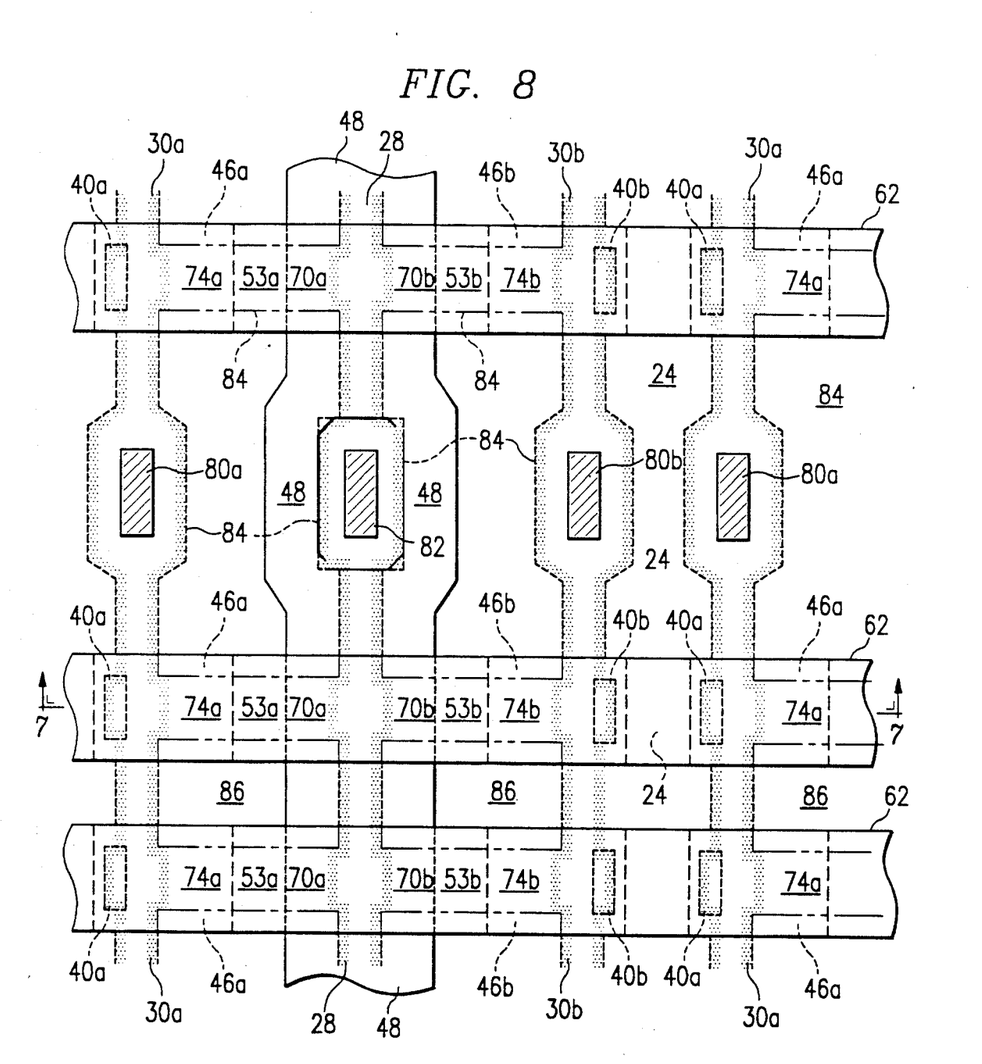
FIG. 8 is a plan view of a section of a memory cell array, the sectional view of FIG. 7 taken substantially along line 7—7 of FIG. 8.

Referring next to FIG. 8, a plan view of an EEPROM memory cell array is shown, with the sectional view shown in FIG. 7 taken substantially along line 7—7 of FIG. 8. FIG. 7 only depicts a portion of the memory array; selected structure of the array has been omitted for the sake of clarity.

The source regions 30a and 30b are elongated diffused bit lines that run in a vertical (y) direction in FIG. 8. The floating gate conductors are shown at 46a and 46b. The field plate conductor 48 overlies an elongated diffused drain region 28. Also shown are the placement of tunnel windows 40a and 40b, and subchannel regions 74a, 53a, 70a, 70b, 53b and 74b for each of three pairs of cells. The tunnel window can be as long as the width of the stack.

Three control gate conductors 62 are shown. Control gate conductors 62 are elongated in a horizontal (x) direction and each form a word line for a row of cells.

As explained in conjunction with FIG. 7, contacts are made between the diffused bit lines 30a, 28 and 30b to metal bit lines overlying them. A contact 80a is provided for the diffused bit line 30a. Bit line 30a is extended in an x direction in the area of contact 80a so that proper contact can be made. A similar contact 80b is provided for diffused bit line 30b. A contact 82 is provided for the diffused bit line 28. The field plate conductor 48 is split and routed around the area of the contact 82 to avoid interference with it.

Isolating oxide regions 84 and 86 are formed at the same time as oxide regions 24 (see FIG. 1), and have boundaries partially indicated by dotted and dashed lines. Oxide region 84 acts to isolate one contact area, such as area 82, from adjacent areas 80a and 80b. Oxide region 84 also acts to define adjacent horizontal boundaries of the channel regions 38a and 38b (consisting of subchannel regions 74a, 53a, 70a, 74b, 53b, 70b; see FIG. 7). Rectangular oxide regions 86 isolate adjacent channel regions 38a and 38b from one another in a columnar direction.

In another embodiment, the field plate conductor 48 extends partially over only one of the channel regions 38a or 38b, but not the other one. As such, only one of the two subchannel regions 70a and 70b is defined by the field plate conductor 48. Only one of the subchannel regions 70a or 70b is necessary to isolate one of the cells from the other cell of the cell pair. This alternative embodiment saves further array area.

Figure 9:
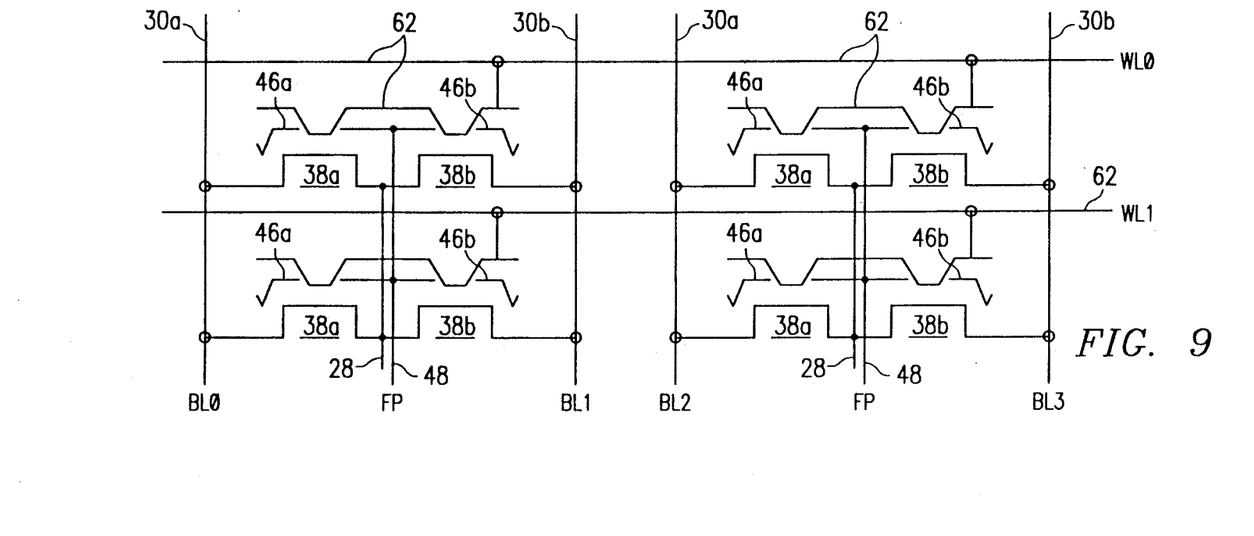
FIG. 9 is an electrical schematic diagram of a small section of an array of cells according to the invention.

FIG. 9 is an electrical schematic diagram of four pairs of EEPROM cells. In FIGS. 1-9, like characters identify like parts so that the structural components of the EEPROM cells and their electrical representations may be compared. Each row of cells is provided with a word line conductor WL0 or WL1. Each column of cell pairs is provided with two bit lines such as BL0, BL1. Each column of cells further has a drain connection 28 and a field plate conductor 48. The conductances of various subchannel regions of channel regions 38a and 38b are respectively controlled by the floating gate conductors 46a and 46b, the control gate 62 and the field plate conductor 48.

The operation of the cell can best be described in conjunction with FIG. 9, the table of voltages given below, and FIG. 10.

TABLE

READ, WRITE AND ERASE VOLTAGES

| | Read | | Write | Erase | |
|---|---|---|---|---|---|
| | Alt 1 | Alt 2 | "0" | Selected | Flash |
| Selected Word Line (Control Gate) | 3 V | 3 V | ~18 V | −5 V | −10 V |
| Deselected Word Lines | 0 V | 0 V | 7 V–10 V | 10 V | — |
| Selected Bit Line (Source Region) | 0 V | 1.5 V | 0 V | 10 V | 5 V |
| Deselected Bit Lines (Source Regions) | Float | 0 V | 6 V–7 V | 0 V | 5 V |
| Drain | ~1.5 V | 0 V | Float | Float | Float |
| Poly 1 Field Plate | 5 V | 5 V | ≦0 V | ≦0 V | ≦0 V |

Figure 10:
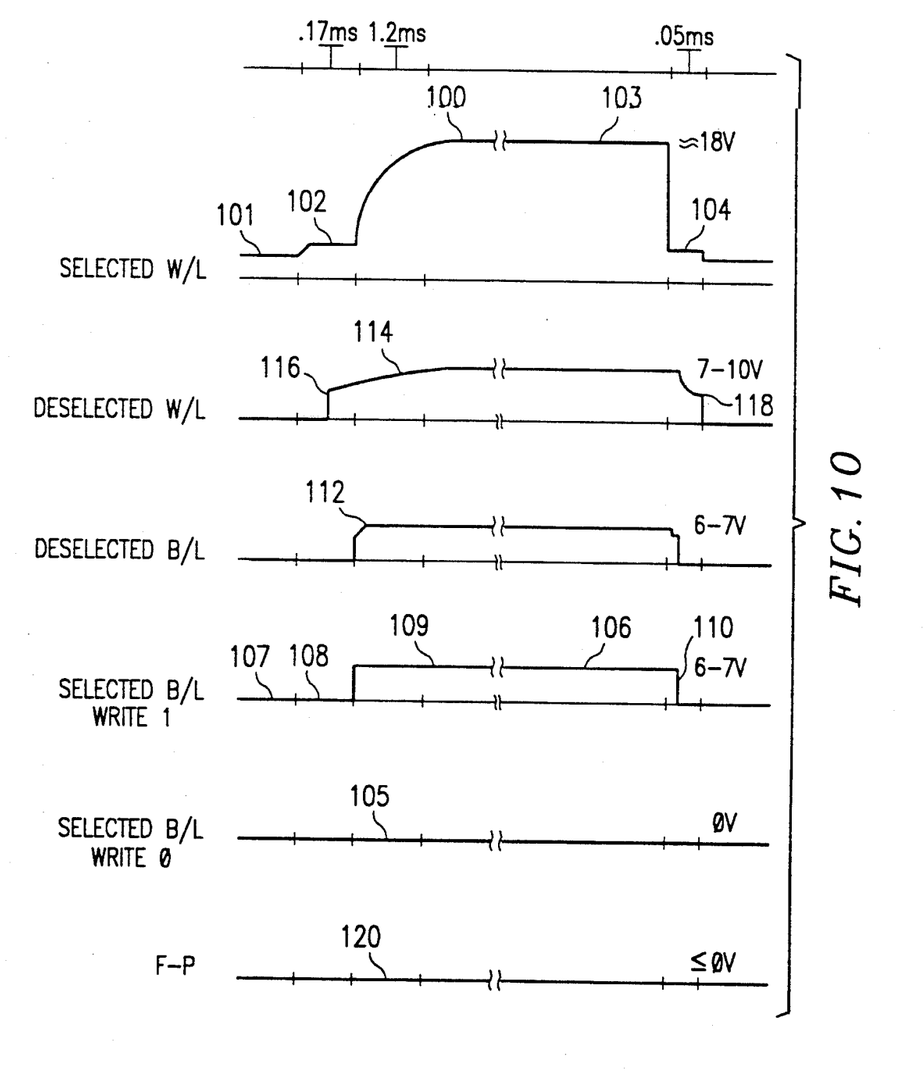
FIG. 10 is a set of voltage timing diagrams illustrating applied voltages during the programming of a selected EEPROM cell.

FIG. 10 is a voltage/timing diagram for various inputs of the device in writing to one particular floating gate conductor, such as that within cell (1,1) shown circled in FIG. 9.

Curve 100 is that of the voltage on the selected word line WL1. Before the program command is acknowledged, the voltage value of this word line is the "read mode" value of approximately 3 volts. This is shown by curve segment 101. Upon acknowledgment of the program command, the voltage value of this word line is first changed to $V_{DD}$ during a small period of time such as 0.17 milliseconds, and is then raised to the full programming voltage of 18 volts during a time of 1.2 milliseconds. The curved, smooth transition from $V_{DD}$ at 102 to the 18 volt level at 103 is required to limit the electrical field stress across the memory cell.

The programming time at 18 volts is selected to be sufficiently long to program the floating gate conductor 46b with a negative voltage such as −2 to −4 volts. After the specified programming time has elapsed, the voltage value of the word line is changed rapidly from 18 volts back to $V_{DD}$ at 104, where it stays for a period of 0.05 milliseconds. Thereafter, the voltage value is further reduced to "read mode" where it will remain until a further program command is acknowledged.

The voltage curve on the selected bit line BL1 where a "0" is desired to be written is shown at 105. The voltage of the selected bit line remains at 0 volts throughout all times of the programming, such that a voltage difference of approximately 18 volts exists between the word line conductor WL1 and the selected bit line BL1. This will cause electrons to tunnel through the respective tunnel window 40b (see FIG. 7) under the influence of this electric field. A "zero" will be written to the floating gate conductor 46b. The presence of a substantial negative voltage on the floating gate conductor 46b will in turn render the subchannel region 74b nonconductive; reading the source region 30b (FIGURE 7) as a result will yield a "zero" bit.

Where a "one" is desired to be written to the cell (1,1), a curve 106 will exist on BL1 during the programming phase. Within segments 107 and 108, the voltage on the selected bit line BL1 remains in its "read mode" state of 0 volts. After the selected word line has begun to be raised to 18 volts, the voltage value of BL1 is raised to a value in the range of 6 to 7 volts at time 109. In the illustrated structure, the coupling coefficient between the word line conductor 62 and the floating gate conductor 46b is approximately 0.7 to 0.8. Therefore, a programming voltage of 18 volts on a word line conductor will be reflected in a voltage of approximately 12 to 13 volts on the floating gate conductor 46b. The voltage difference between the floating gate conductor at 12 to 13 volts and BL1 at 6 to 7 volts is insufficient to cause programming of the floating gate conductor 46b through Fowler-Nordheim tunneling.

At time 110, the voltage value of the selected bit line is reduced back to its "read mode" state of 0 volts. This occurs after the voltage value of the selected word line has been dropped from $V_{PP}$ to $V_{DD}$ during segment 104. The voltage curve for deselected bit lines, such as BL0, BL2 and BL3 in FIG. 9, is shown at 112. Before the program command is acknowledged, the voltage value of the deselected bit lines will be the "read mode" value of 0 volts. After the program command has been acknowledged, the voltage value of the deselected bit lines will remain at 0 volts until the voltage value of the selected word line WL1 is raised from $V_{DD}$ to 18 volts. Concurrently or before the word line begins to be raised from $V_{DD}$ to 18 volts, the voltage value of the deselected bit lines is raised, where it stays throughout the programming. Concurrently with or after the decrease of the voltage of the selected word line WL1 from 18 volts to $V_{DD}$, the voltage of the deselected bit lines is decreased back to 0 volts. This deselected bit line voltage prevents "write disturb" of nonselected bits sharing the selected word line.

A voltage timing diagram for the deselected word lines, such as WL0 in FIG. 9, is shown at 114. As described above, it is necessary to apply 6 to 7 volts to the deselected bit lines and those selected bit lines where "1" is desired to be written to the selected bit. These bit line voltages in turn create a possibility of erasing previously programmed bits associated with the deselected word lines. To avoid this write disturb, it is preferred that the voltage of the deselected word lines be raised starting at time 116 to a voltage in the range of 7 to 10 volts before the deselected bit line voltage is raised from 0 volts to 6 to 7 volts. After ramping up to 7 to 10 volts, the voltage of the deselected word lines remains at this value throughout the programming. The voltage value is dropped back to its "read mode" state of 0 volts at time 118, which occurs only after the voltage value on the deselected bit lines has been reduced to its read mode state of 0 volts.

The voltage curve for the field plate 48 is shown at 120. During the programming mode, the voltage of the field plate conductor 48 remains at 0 volts or a negative voltage value to prevent any drain to source current.

In order to read a cell, a voltage of about 3 volts is placed on the selected word line WL1. This control gate read voltage is selected so as to be sufficient to render channel subregions 53a and 53b (FIG. 7) conductive, but nonetheless to be low enough to prevent a disturb of the floating gate conductors 46a and 46b. Deselected word lines (WL0, WL2) have zero volts impressed on them so as to render subchannel regions 53a and 53b non-conductive for all cells in deselected columns.

The Table gives first and second alternative methods for reading the cell, under appropriate columns labeled Alt 1 and Alt 2. According to the Alt 1 method, the selected bit line BL1 has zero volts impressed thereon, and the drain 28 has a positive voltage $V_{dd}$ such as 1.5 volts impressed on it to cause a potential drop to exist between the drain region 28 and the selected bit line BL1. To complete conductance across the entire channel region 38b (FIG. 7), the field plate conductor 48 has a predetermined voltage, such as five volts, placed on it that is sufficient to render the subchannel region 70b conductive. Therefore, whether the entire channel region is rendered conductive or not will depend on the present electric potential of the floating gate conductor 46b, which in turn controls the conductance of the channel subregion 74b. In this manner, the presence or absence of current can be detected at the selected bit line BL1.

According to the second alternative method Alt 2, the deselected bit lines or source regions are allowed to float. The drain is held at zero volts while about 1.5 volts is placed on the selected bit line. Reading occurs at the drain region according to the Alt 2 method.

In order to do a selected erase, the selected word line WL1 has a negative potential such as −5 volts impressed thereon. Meanwhile, the selected bit line BL1 has a positive voltage such as ten volts impressed thereon. The deselected bit lines BL0, BL2 and BL3 meanwhile have a lower potential such as 0 volts impressed on it. There will therefore be an electric field adequate for an erase between the selected word line WL1 and the selected bit line BL1 while a small electric field that is insufficient to cause an erase will exist between the deselected word lines and the selected bit line BL1. During erasing, the excess electrons will be removed from the floating gate conductor 46b and hence the "zero" state will be erased. Also, during this erase operation, the drain region 28 is allowed to float, and the field plate conductor 48 is held at zero volts or a negative voltage value to render the channel region 38b non-conductive.

To perform a flash-erase, all word lines 62 will have a negative potential such as −10 volts impressed thereon, and all bit lines will have a positive potential such as five volts impressed thereon.

An alternative, selective erasing method is to apply a large positive voltage such as 15 volts to the selected source region 30b, allow the selected drain region 28 to float, and connecting the selected control gate 62 to reference potential or zero volts. The use of this erasing method avoids the need for a negative voltage supply.

In summary, a "flash-eraseable" electrically programmable read only memory cell has been shown and described, wherein two adjacent columns of such cells share the same drain region, thus saving device area and relaxing metal pitch, since only 1½ metal column conductors are required per cell.

While a preferred embodiment of the invention and its advantages has been set forth in the above detailed description, the invention is not limited thereto but only by the scope and spirit of the appended claims.

What is claimed is:

1. First and second electrically programmable memory cells formed at a face of a semiconductor layer of a first conductivity type, comprising:
    a drain region formed at said face to be of a second conductivity type opposite said first conductivity type;
    first and second source regions formed at said face to be of said second conductivity type and to be spaced from said drain region and each other; a first channel region defined at said face between said first source region and said drain region, a second channel region defined at said face between said second source region and said drain region, each channel region comprising first, second, and third subchannel regions;
    a first floating gate conductor having a portion thereof insulatively disposed adjacent said first subchannel region of said first channel region so as to render the last said subchannel region conductive when a predetermined voltage is impressed on said first floating gate conductor, said first floating gate conductor electrically coupled to said first source region so as to permit selective programming of said first floating gate conductor;
    a second floating gate conductor having a portion thereof insulatively disposed adjacent said first subchannel region of said second channel region so as to render the last said subchannel region conductive upon a predetermined voltage being impressed on said second floating gate conductor, said second floating gate conductor electrically coupled to said second source region so as to permit selective programming of said second floating gate conductor;
    a control gate conductor insulatively disposed adjacent said second subchannel regions so as to render the last said subchannel regions conductive upon impressing a predetermined voltage on said control gate conductor;
    a field plate conductor extending over said drain region and insulatively disposed adjacent said third subchannel regions so as to render said third subchannel regions conductive upon the imposition on said field plate conductor of a predetermined read voltage.

2. The cells of claim 1, and further comprising a thick insulator layer formed adjoining said drain region, said field plate conductor adjoining said thick insulator layer.

3. The cells of claim 1, and further comprising respective Fowler-Nordheim tunneling windows each disposed between a respective source region and a respective floating gate conductor so that said floating gate conductors may be selectively programmed through Fowler-Nordheim tunneling.

4. The cells of claim 3, and further comprising thick insulator layers formed over said respective source regions, said first subchannel regions disposed on respective first sides of said thick insulator layers, a tunnel window for each source region disposed on a second side of a respective thick insulator layer opposed to said first side and disposed between said respective source region and said respective floating gate conductor.

5. The cell of claim 1, in which said third subchannel region is nonconductive upon application of a predetermined field plate programming voltage to said field plate conductor and is nonconductive upon application of a predetermined field plate erase voltage to said field plate conductor.

6. An array of electrically erasable and programmable read only memory cells formed at a face of a semiconductor layer of a first conductivity type, comprising:
    a plurality of parallel, elongate source regions formed at said face to be of a second conductivity type opposite said first conductivity type;
    for each pair of source regions, an elongate drain region formed in between and spaced from said pair of source regions substantially in parallel thereto to be of said second conductivity type;
    for each pair of source regions and drain region formed between said pair of source regions, a plurality of first channel regions formed between said drain region and a first one of said source regions of said pair at an angle to said source and drain regions, said first channel regions spaced apart from each other, a plurality of second channel regions formed between said drain region and a second one of said source regions of said pair at an angle thereto and spaced apart from each other, each said first and second channel regions respectively divided into first, second and third subchannel regions, a cell associated with each channel region;
    for each cell, a floating gate conductor insulatively disposed adjacent a respective first subchannel region and said source region so as to be selectively programmable;
    for each drain region, a field plate conductor extending over said drain region and insulatively disposed adjacent said third subchannel regions of the first channel regions between said drain region and a first one of said pair of source regions between which said drain region is formed and said third subchannel regions of the second channel regions between said drain region and a second one of said pair of source regions between which said drain region is formed to control the conductance thereof; and
    a plurality of rows of said cells formed at an angle to said columns of source regions and drain regions, for each said row a word line conductor insulatively disposed adjacent said floating gate conductors and said second subchannel regions of said cells in said row so as to control the conductance of said second subchannel regions and to program said respective floating gate conductors.

7. The array of claim 6, and further comprising:
    a plurality of metal lines formed over respective ones of said drain regions and insulated from said field plate conductors, at least one conductive contact to each drain region made from a respective metal line, a drain region contact area including said contact defined to extend outwardly from said drain region to said metal line and laterally offset from said rows, said field plate conductor routed laterally around the periphery of said contact area.

8. The cell of claim 6, in which said third subchannel regions are conductive upon application of a predetermined field plate read voltage to an associated field plate conductor, nonconductive upon application of a predetermined field plate programming voltage to an associated field plate conductor, and are nonconductive upon application of a predetermined field plate erase voltage to an associated field plate conductor.

* * * * *